(12) United States Patent
Park et al.

(10) Patent No.: US 9,552,874 B2
(45) Date of Patent: Jan. 24, 2017

(54) COMBINED MEMORY BLOCK AND DATA PROCESSING SYSTEM HAVING THE SAME

(75) Inventors: Hae Chan Park, Ichon-si (KR); Sung Cheoul Kim, Ichon-si (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 775 days.

(21) Appl. No.: 13/339,954

(22) Filed: Dec. 29, 2011

(65) Prior Publication Data

US 2013/0103892 A1    Apr. 25, 2013

(30) Foreign Application Priority Data

Oct. 20, 2011  (KR) .................. 10-2011-0107635

(51) Int. Cl.
| G06F 12/02 | (2006.01) |
| G11C 11/56 | (2006.01) |
| G11C 13/00 | (2006.01) |
| G11C 16/06 | (2006.01) |

(52) U.S. Cl.
CPC ........ G11C 11/5607 (2013.01); G11C 11/5678 (2013.01); G11C 13/0004 (2013.01); G11C 16/06 (2013.01); *G11C 2211/5642* (2013.01); *G11C 2213/71* (2013.01)

(58) Field of Classification Search
None
See application file for complete search history.

(56) References Cited

U.S. PATENT DOCUMENTS

| 8,487,450 B2 * | 7/2013 | Mouli ........................... 257/777 |
| 2008/0229026 A1 * | 9/2008 | Chung .......................... 711/132 |
| 2010/0082857 A1 * | 4/2010 | Klein .............................. 710/51 |
| 2010/0226165 A1 * | 9/2010 | Kang ........................ G11C 5/02 365/148 |
| 2010/0246257 A1 * | 9/2010 | Ito ....................... G11C 11/5621 365/185.03 |
| 2011/0194336 A1 * | 8/2011 | Mouli .......................... 365/158 |
| 2012/0056151 A1 * | 3/2012 | Mouli .............................. 257/9 |
| 2012/0198132 A1 * | 8/2012 | Han ............................. 711/103 |

FOREIGN PATENT DOCUMENTS

CN             1649158        8/2005

* cited by examiner

*Primary Examiner* — Charles Rones
*Assistant Examiner* — Ryan Dare
(74) *Attorney, Agent, or Firm* — IP & T Group LLP

(57) ABSTRACT

A combined memory block includes a first memory unit configured to store data and an additional memory unit that forms a stacked structure with the memory unit, wherein the memory unit and the storage unit together form multi-level cells having variable resistance in storing data.

11 Claims, 2 Drawing Sheets

COMBINED MEMORY BLOCK AND DATA PROCESSING SYSTEM HAVING THE SAME

CROSS-REFERENCES TO RELATED APPLICATION

The present application claims priority under 35 U.S.C. 119(a) to Korean application number 10-2011-0107635, filed on Oct. 20, 2011, in the Korean Patent Office, which is incorporated by reference in its entirety as if set forth in full.

BACKGROUND OF THE INVENTION

1. Technical Field

The exemplary embodiments of the present invention relate to semiconductor integration circuit apparatus, and more particularly, to a combined memory block including a variable resistance cell and a data processing system including the same.

2. Related Art

Memory devices are classified into random access memories (RAMs), which are volatile memories having data erased upon power off and read only memories (ROMs), which are nonvolatile memories that retain data upon power off. Here, dynamic RAM (DRAM) devices are representative RAMs and flash memory devices are representative ROMs.

While DRAM devices are advantageous due to their high speed operation from having easier random data access, DRAMs use a periodic refresh due to their volatile property and use large capacity capacitors.

On the other hand, while flash memory devices are advantageous for high integration density and avoidance of refresh operations, flash memory devices use a high operation voltage due to having a stack structure of two gates compared to a power voltage and use a separate boosting circuit for generating a voltage used for a read and write operation. In addition, since it is difficult to randomly access flesh memory devices, a program is performed for a page unit at a time and thus, an operation speed thereof is relatively slow.

As sizes of semiconductor memory devices gradually decrease, the implementation of a system on chip (SOC) in which function blocks having various functions are integrated on one chip is becoming more popular.

More specifically, a SOC type data processing system has a structure in which basic memories and various types of memories and non-memory chips of different functions are combined.

However, since chips having different driving conditions are mounted in a data processing system, separate driving circuits are used and thus the manufacturing process of the data processing system may become complicated and costly.

SUMMARY

According to one aspect of an exemplary embodiment, a combined memory block includes a first memory unit configured to control address mapping and store data and an additional memory unit that forms a stacked structure with the memory unit, wherein the memory unit and the storage unit together form multi-level cells having variable resistance in storing data.

According to another aspect of an exemplary embodiment, a data processing system includes a central processing unit, a control block configured to interface with the central process unit, and a combined memory block configured to interface with the control block. The combined memory block includes a first memory unit configured to control mapping of an address provided from the control block, and an additional memory unit that forms a stacked structure with the first memory unit, wherein the first memory unit and the storage unit together form multi-level cells having variable resistance in storing data.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Figure 1:
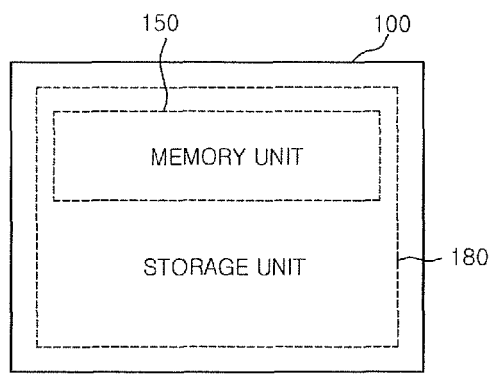
FIG. 1 is a block diagram illustrating a combined memory block of a data processing system according to an exemplary embodiment.

Hereinafter, exemplary embodiments will be described in greater detail with reference to the accompanying drawings.

Exemplary embodiments are described herein with reference to illustrations that are schematic illustrations of exemplary embodiments (and intermediate structures). As such, actual sizes and proportions of implemented exemplary embodiments may vary from the illustrated sizes and proportions. Further, exemplary embodiments should not be construed as limited to the particular shapes of regions illustrated herein but construed to include deviations in shapes that result from actual implementations. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIG. 1 is a block diagram illustrating a combined memory block of a data processing system according to an exemplary embodiment of the present invention.

Referring to FIG. 1, a combined memory block 100 includes a memory block/unit 150 and a storage block/unit 180.

Figure 2:
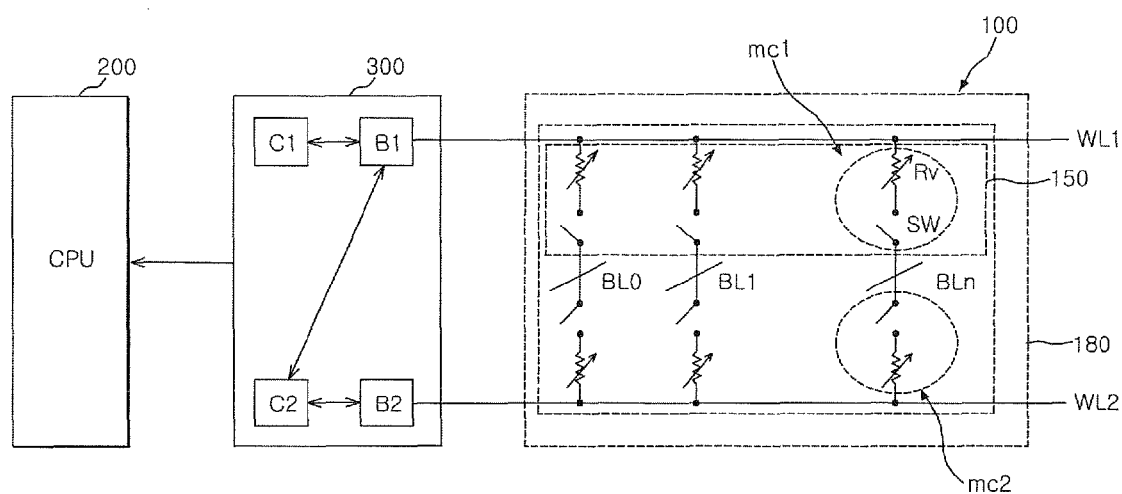
FIG. 2 is a block diagram illustrating a data processing system according to an exemplary embodiment of the present invention.

When data used by a central processing unit (CPU) (200 of FIG. 2) is not present in the memory block/unit 150 of the combined memory block 100, the CPU transmits a command and address to a control block (300 of FIG. 2). The control block 300 writes the input command and address in the storage block 180 according to a set interface method.

The storage block 180 automatically performs a read/write operation when the respective command and address are input thereto. Page data read from a memory core (not shown) of the storage block 180 is temporarily stored in a page buffer disposed within the storage block 180. The page data stored in the page buffer is transmitted to the memory block 150 in fixed amounts of data. When data is transmitted to the memory block 150, the CPU 200 in turn receives data transmitted to the memory block 150.

Here, the storage block 180 is a memory device which includes a plurality of memory cell arrays and a page buffer and has a high data processing speed and a long operation lifetime. The memory block 150 is a memory device which has easier random access and low power consumption.

The memory block 150 and the storage block 180 according to the exemplary embodiment may be configured of memory cells each having variable resistance. According to an example, the memory block 150 may be a part of the storage block 180.

In having the memory block 150 to control address mapping of the storage block 180 as described above and allowing easier random access and low power consumption, single-level variable resistance cells (SLC) may be used in the memory block 150 according to the exemplary embodiment.

Figure 3:
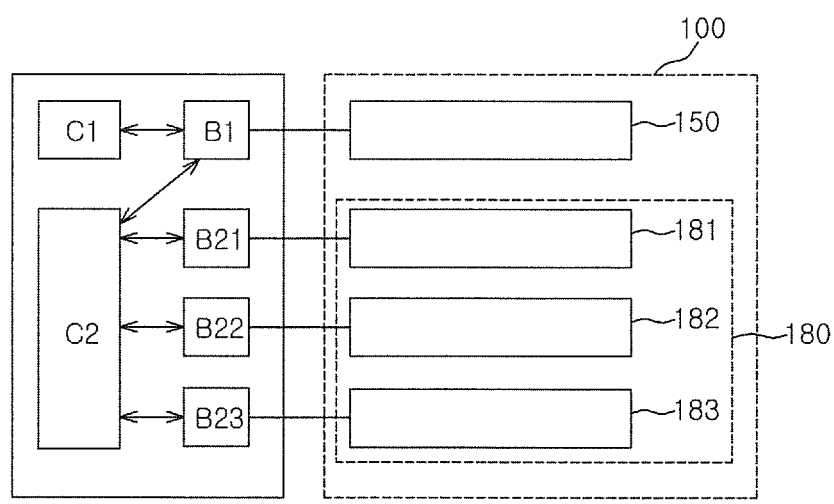
FIG. 3 is a block diagram illustrating a data processing system according to another exemplary embodiment of the present invention.

The storage block 180 may include a plurality of memory cell arrays and use a multi-level variable resistance cell (MLC) capable of implementing multi bit storage to store a large amount of data. Here, MLCs may be implemented by combining SLCs including SLCs of the memory block 15 or by using true MLCs as described below in connection with FIG. 3.

In the exemplary embodiment, the variable resistance cell includes a phase-change memory cell. Alternatively, a resistive RAM (ReRAM) cell or a spin transfer torque magnetoresistive RAM (STTMRAM) cell may be used.

The data processing system will be described in more detail with reference to FIG. 2. The data processing system may include a CPU 200, a control block 300, and a combined memory block 100.

As described above, the control block 300 interfaces between the CPU 200 and the combined memory block 100. The control block 300 includes controllers C1 and C2 and buffers B1 and B2. The controllers C1 and C2 provide input command and address to the buffers B1 and B2. The control block 300 in the exemplary embodiment includes a first controller C1, a second controller C2, a first buffer B1, and a second buffer B2. The first buffer B1 interfaces between the first and second controllers C1 and C2 and the second buffer B2 interfaces with the second controller C2. The first and second buffers B1 and B2 buffer voltages received from the first and/or second controller C1 and C2 and transmit the buffered voltage to the combined memory block 100.

The combined memory block 100 may include a pair of word lines WL1 and WL2. A first word line WL1 is electrically connected to the first buffer B1, and a second word line WL2 is electrically connected to the second buffer B2. Here, the buffers B1 and B2 correspond to respective word lines and the controllers C1 and C2 may be divided into controller for a memory unit and a controller for a storage unit, respectively, according to their functions.

A plurality of bit lines BL0 to BLn are included between the first word line WL1 and the second word line WL2. The plurality of bit lines BL0 to BLn may be disposed in a direction crossing the first and second word line WL1 and WL2. A first variable resistance cell (mc1) configured of a variable resistor Rv and a switch SW is connected between the first word line WL1 and each of the plurality of bit lines BL0 to BLn. A second variable resistance cell (mc2) configured of a variable resistor Rv and a switch SW is connected between each of the plurality of bit lines BL0 to BLn and the second word line WL2

Here, the first variable resistance cells mc1 may correspond to a memory unit 150 of the combined memory block 100 and the first and second variable resistance cells mc1 and mc2 may correspond to a storage unit 180 of the combined memory block.

The first and second variable resistance cells mc1 and mc2 may each be formed a phase-change memory cell. Alternatively the first and second variable resistance cells mc1 and mc2 may each be formed of a resistive memory cell or a magnetoresistive memory cell depending on a material constituting a resistor of the memory cell. The switch SW may be constituted of at least one of a diode and a transistor.

As shown in FIG. 2, the first and second variable resistance cells mc1 and mc2 are configured in a stacked form with respect to each other. The word lines WL1 and WL2 are also configured in a stacked form and the bit lines BL0 to BLn are interposed between the stacked word lines WL1 and WL2.

The memory unit 150 is configured in a SLC type to perform 2-bit operations quickly like DRAMs and to perform program and verify operations relatively easily.

The storage unit 180 have memory cells that are each configured as an MLC by stacking the first and second variable resistance cells mc1 and mc2 and connecting the first and second variable resistance cells mc1 and mc2 to the first and second word lines WL1 and WL2, respectively, thereby storing multiple-level data. Although the storage unit 180 is configured as the MLC type and uses a large program and verify time compared to the memory unit 150, the storage unit 180 in the exemplary embodiment can perform program and verify operations at high speed.

The storage unit 180 implemented with the multi-level variable resistance cells mc1 and mc2 can be controlled by the first and second word lines, respectively, to cause the first variable resistance cells mc1 to be driven as part of the memory unit 150 or as part of the storage unit 180.

The memory unit 150 and the storage unit 180 configured of the variable resistance cells are configured to be stacked so that the area occupied the data processing system can be reduced.

According to the exemplary embodiment of the present invention, the memory unit 150 constituting the combined memory block 100 is configured as the SLCs capable of turning on/off at high speed and the storage unit 180 implemented with the MLCs along with the SLCs of the memory unit 150 so that a storage function can be maximized. The present invention is not limited to the above-described exemplary embodiment.

Although the above-described exemplary embodiment has been illustrated so that the storage unit 180 implements MLCs by combining SLCs including the memory unit 150, according to another exemplary embodiment of the present invention, while the memory unit 150 may be SLCs, the storage unit 180 may implement MLCs by using storage units/memory units 181, 182, and 183 that are each configured as MLCs. In this case, the number of buffers B21, B22, and B23 of the control block 300 may be the same as the number of word lines.

The above-described exemplary embodiments are exemplary only, and the present invention should include all embodiments consistent with the exemplary features as described above and in the accompanying drawings and claims.

What is claimed is:
1. A combined memory block, comprising:
   a memory unit configured to store a data required from a central processing unit and to interface with a control block;

a storage unit configured to store the data which the central processing unit requires according to a command and address provided from the control block interfaced with the central processing unit, when the memory unit does not have the data which the central processing unit requires;

a cell array region including a plurality of memory cell arrays which are stacked, wherein a memory cell array of the plurality of memory cell arrays corresponds to the memory unit, and the other memory cell arrays of the plurality of memory cell arrays corresponds to the storage unit;

a first buffer interfaced with the memory unit; and a second buffer interfaced with the storage unit, wherein the control block includes a first controller interfaced with the first buffer and a second controller interfaced with the first and second buffers, and wherein the memory unit and the storage unit are integrated in a chip, the memory unit is stacked on the storage unit so that the memory unit and the storage unit are constitute of multi-level memory cells (MLC) having variable resistance in storing data, the memory unit corresponds to single-level memory cells among the multi-level memory cells (MLC) and the memory unit is configured to control an address mapping of the storage unit.

2. The combined memory block of claim 1, wherein the storage unit includes single-level memory cells (SLC) having variable resistance.

3. The combined memory block of claim 1, wherein the storage unit includes a multi-level memory cells (MLC) having variable resistance.

4. The combined memory block of claim 1, wherein the memory unit includes:
a first word line;
a plurality of bit lines arranged to be crossed with the first word line; and
a plurality of first variable resistance cells formed between the first word line and the plurality of bit lines.

5. The combined memory block of claim 4, wherein the storage unit includes:
a second word line formed to be stacked on the first word line; and
a plurality of first variable resistance cells formed between the second word line and the plurality of bit lines.

6. The combine memory block of claim 5, wherein the second word line includes a plurality of word lines which are stacked.

7. A data processing system, comprising:
a central processing unit;
a control block configured to interface with the central process unit, the control block including a first controller and a second controller; and
a combined memory block configured to interface with the control block,
wherein the combined memory block includes:
a memory unit configured to store a data required from the central processing unit and to interface with the first controller;
a storage unit configured to store the data which the central processing unit requires according to a command and address provided from the control block, when the memory unit does not have the data which the central processing unit requires and to interface with the first and second controllers; and
a cell array region including a plurality of memory cell arrays which are stacked, wherein a memory cell array of the plurality of memory cell arrays corresponds to the memory unit, and the other memory cell arrays of the plurality of memory cell arrays corresponds to the storage unit;

wherein the memory unit and the storage unit are integrated in a chip, the memory unit is stacked on the storage unit so that the memory unit and the storage unit are constitute of multi-level memory cells (MLC) having variable resistance in storing data, the memory unit corresponds to single-level memory cells among the multi-level memory cells (MLC) and the memory unit is configured to control an address mapping of the storage unit.

8. The data processing system of claim 7, wherein the storage unit includes a single-level memory cells (SLC) having variable resistance.

9. The data processing system of claim 7, wherein the storage unit includes a multi-level memory cells (MLC) having variable resistance.

10. The data processing system of claim 7, wherein the combined memory block includes:
first and second word lines that form a stacked structure;
a plurality of bit lines located between the first and second word lines;
a first variable resistance cell connected between the first word line and each of the plurality of bit lines, wherein the first variable resistance cell is included in the memory unit; and
a second variable resistance cell connected between the second word line and each of the plurality of bit lines, wherein the second variable resistance cell is included in the storage unit.

11. The data processing system of claim 10, further comprising:
a first buffer interfaced with the first and second controllers and connected with the first word line; and
a second buffer interfaced with the second controller and connected with the second word line.

* * * * *